(12) United States Patent
Nogami

(10) Patent No.: US 7,780,790 B2
(45) Date of Patent: Aug. 24, 2010

(54) VACUUM PROCESSING APPARATUS

(75) Inventor: Hiroshi Nogami, Tama (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 0 days.

(21) Appl. No.: 12/566,205

(22) Filed: Sep. 24, 2009

(65) Prior Publication Data

US 2010/0037821 A1    Feb. 18, 2010

Related U.S. Application Data

(63) Continuation of application No. PCT/JP2008/054949, filed on Mar. 18, 2008.

(30) Foreign Application Priority Data

Mar. 28, 2007   (JP) .............................. 2007-083298

(51) Int. Cl.
| | |
|---|---|
| C23C 16/00 | (2006.01) |
| C23C 16/455 | (2006.01) |
| C23C 16/50 | (2006.01) |
| C23C 16/505 | (2006.01) |
| H01L 21/3065 | (2006.01) |

(52) U.S. Cl. ............. 118/715; 118/723 E; 118/723 ER; 156/345.33; 156/345.34; 156/345.43; 156/345.47

(58) Field of Classification Search ................ 118/715, 118/723 E, 723 ER; 156/345.33, 345.34, 156/345.43, 345.47
See application file for complete search history.

(56) References Cited

U.S. PATENT DOCUMENTS

| | | | | |
|---|---|---|---|---|
| 5,944,899 | A  * | 8/1999 | Guo et al. ................... | 118/715 |
| 6,245,396 | B1 * | 6/2001 | Nogami ...................... | 427/562 |
| 6,758,224 | B2 * | 7/2004 | Nogami ...................... | 134/22.1 |
| 6,892,669 | B2 * | 5/2005 | Xu et al. ................... | 118/723 E |
| 2001/0003014 | A1 | 6/2001 | Yuda | |
| 2001/0042512 | A1 * | 11/2001 | Xu et al. .................. | 118/723 R |

(Continued)

FOREIGN PATENT DOCUMENTS

JP    5-55150 A    3/1993

(Continued)

OTHER PUBLICATIONS

International Search Report for PCT/JP2008/054949 completed Jun. 13, 2008.

(Continued)

*Primary Examiner*—Jeffrie R Lund
(74) *Attorney, Agent, or Firm*—Buchanan Ingersoll & Rooney PC

(57) ABSTRACT

Disclosed is a vacuum processing apparatus in which a conducive partition having a plurality of through holes is formed inside a vacuum processing vessel, and an internal space of the vacuum processing vessel is partitioned into a plasma generating space in which a high-frequency electrode is installed to function as a counter electrode with respect to the partition, and a substrate processing space in which a substrate is set. This vacuum processing apparatus includes a gas reservoir formed on a sidewall of the vacuum processing vessel and communicating with the plasma generating space, and a gas supply system connected to the gas reservoir to supply a gas to the gas reservoir.

3 Claims, 6 Drawing Sheets

U.S. PATENT DOCUMENTS

| | | | |
|---|---|---|---|
| 2002/0096188 A1* | 7/2002 | Nogami | 134/1.1 |
| 2003/0091753 A1* | 5/2003 | Han et al. | 427/569 |
| 2004/0071874 A1* | 4/2004 | Shimizu et al. | 427/248.1 |
| 2004/0173157 A1* | 9/2004 | Han et al. | 118/715 |
| 2004/0194708 A1* | 10/2004 | Nogami | 118/723 E |
| 2007/0119371 A1* | 5/2007 | Ma et al. | 118/723 E |
| 2008/0276957 A1 | 11/2008 | Nogami | |
| 2010/0037821 A1* | 2/2010 | Nogami | 118/723 E |

FOREIGN PATENT DOCUMENTS

| | | |
|---|---|---|
| JP | 7-263353 A | 10/1995 |
| JP | 11-26190 A | 1/1999 |
| JP | 2001-164371 A | 6/2001 |

OTHER PUBLICATIONS

Written Opinion for PCT/JP2008/054949 completed Jun. 13, 2008.

* cited by examiner

VACUUM PROCESSING APPARATUS

This application claims the benefit of Japanese Patent Application No. 2007-83298, filed Mar. 28, 2007, which is hereby incorporated by reference herein in its entirety.

TECHNICAL FIELD

The present invention relates to a vacuum processing apparatus using neutral active species (radicals) and, more particularly, to a CVD (Chemical Vapor Deposition) apparatus for performing deposition on a substrate by using a chemical reaction or a cleaning apparatus for cleaning a substrate. The present invention particularly relates to a vacuum processing apparatus to be suitably used when manufacturing a TFT (Thin Film Transistor) substrate or a semiconductor device such as an MRAM (Magnetoresistive Random Access Memory) or highly integrated circuit.

BACKGROUND ART

Presently, an apparatus that deposits thin films and an apparatus that modifies the surfaces of thin films exist as vacuum processing apparatuses. Among these apparatuses, a microwave plasma processing apparatus including a dielectric-covered line connected to a microwave transmission waveguide and a closed reaction vessel positioned below the dielectric-covered line and incorporating a sample table is known as a CVD apparatus, and is proposed in, for example, patent reference 1. In this microwave plasma processing apparatus, a plurality of gas supply portions are connected to the interior of the closed reaction vessel and communicate with each other via a buffer chamber formed in the upper side portion in the closed reaction vessel, and gas dispersion nozzles forming the gas supply portions are arranged throughout the entire periphery of the buffer chamber. Also, a gas supplied to the buffer chamber is supplied from a shower head covering the whole upper surface of the sample table.

In this apparatus, the gas supplied from the gas supply portions enters the buffer chamber in a dispersed state, and guided to a central portion of the closed reaction vessel after being further dispersed in the buffer chamber. Accordingly, the gas exists in a uniformly dispersed state in the closed reaction vessel, and this makes it possible to uniformly generate a microwave plasma.

Patent reference 1: Japanese Patent Laid-Open No. 5-55150

DISCLOSURE OF INVENTION

Problems that the Invention is to Solve

In addition to the CVD apparatus described above, a CVD apparatus exists in which a conductive partition is formed inside a closed reaction vessel and partitions it into a plasma generating space in which a high-frequency electrode is installed and a substrate processing space in which a substrate holding mechanism for holding a substrate is installed. In this CVD apparatus, neutral active species (radicals) are generated by generating a plasma in the plasma generating space, supplied to the substrate processing space, and allowed to react with a source gas directly supplied to the substrate processing space, thereby performing deposition on a substrate. For this purpose, a plurality of through holes for passing the active species are formed in the partition.

A discharge gas, for example, oxygen gas is supplied to the plasma generating space as the gas is sprayed sideways from four portions of the sidewalls of the plasma generating space. In this discharge gas supply structure, a plasma generated in the plasma generating space is nonuniform, so active species cannot dispersedly be generated. Consequently, the active species passing through the plurality of through holes in the partition become nonuniform. This makes it difficult to achieve a necessary deposition distribution and film property distribution in a CVD apparatus.

Unfortunately, in a CVD apparatus in which the reaction vessel is limited as a plasma generating space by the conductive partition, for example, it is difficult to solve the above-mentioned problem arising when supplying the discharge gas such as oxygen gas by the supply means using the buffer chamber disclosed in patent reference 1. This is so because when the buffer chamber as a structure occupies a part of the plasma generating space filled with a plasma, abnormal discharge occurs between the structure and partition if the structure is not reliably grounded. This poses serious problems in uniformity and homogeneity during deposition.

It is an object of the present invention to provide a vacuum processing apparatus such as a CVD apparatus capable of achieving a uniform deposition distribution and film property distribution. More specifically, it is an object of the present invention to provide a vacuum processing apparatus capable of dispersedly generating neutral active species by uniformly generating a plasma while preventing abnormal discharge in a plasma generating space, thereby preventing the nonuniformity of active species passing through through holes in a partition.

Means of Solving the Problems

To achieve the above object, a vacuum processing apparatus according to the present invention is a vacuum processing apparatus characterized by including:

a conducive partition which is positioned inside a vacuum processing vessel, partitions an internal space of the vacuum processing vessel into a plasma generating space and a substrate processing space, and has a plurality of through holes for communicating with the plasma generating space and the substrate processing space;

a high-frequency electrode which is positioned in the plasma generating space, and is positioned so as to be opposite to said conducive partition;

a gas reservoir is configured by the first insulating member which is positioned in a side of the substrate processing space and has a recessed sectional shape formed along a circumference portion of said conducive partition, and the second insulating member which is positioned along a circumference portion of said high-frequency electrode in a side of the plasma generating space and is arranged so as to be opposite to the first insulating member; and a gas supply system is connected to said gas reservoir in order to supply a gas to said gas reservoir, wherein said gas reservoir has a gap for spraying the gas supplied from said gas supply system to said gas reservoir to the plasma generating space between the second insulating member and an upper surface of the circumference portion of said conducive partition.

Effect of the Invention

Since the vacuum processing apparatus according to the present invention has the gas reservoir, a discharge gas is uniformly supplied from the perimeter of the plasma generating space, so neutral active species can dispersedly be generated by uniformly generating a plasma while preventing abnormal discharge. This makes it possible to prevent the nonuniformity of active species passing through the through holes in the partition, and achieve a uniform deposition distribution and film property distribution in, for example, a CVD apparatus.

Other features and advantages of the present invention will be apparent from the following explanation taken in conjunction with the accompanying drawings. Note that the same reference numerals denote the same or similar parts in the accompanying drawings.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Preferred embodiments of the present invention will exemplarily be explained in detail below with reference to the accompanying drawings. However, constituent elements described in these embodiments are merely examples, and the technical scope of the present invention is determined by the scope of the appended claims and is not limited by the following individual embodiments.

Figure 1:
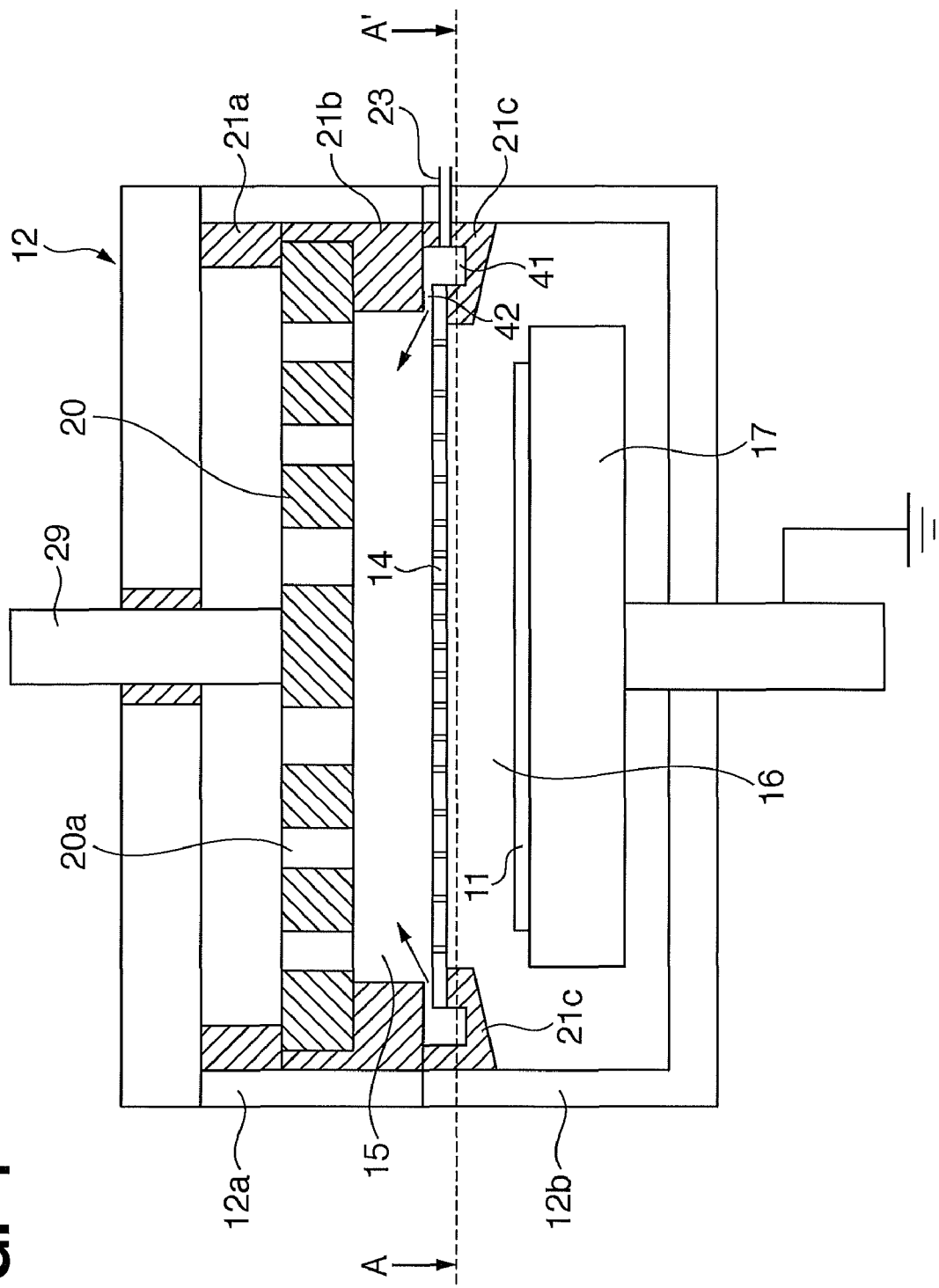
FIG. 1 is a longitudinal sectional view showing the first embodiment of a CVD apparatus according to the present invention.
Figure 2:
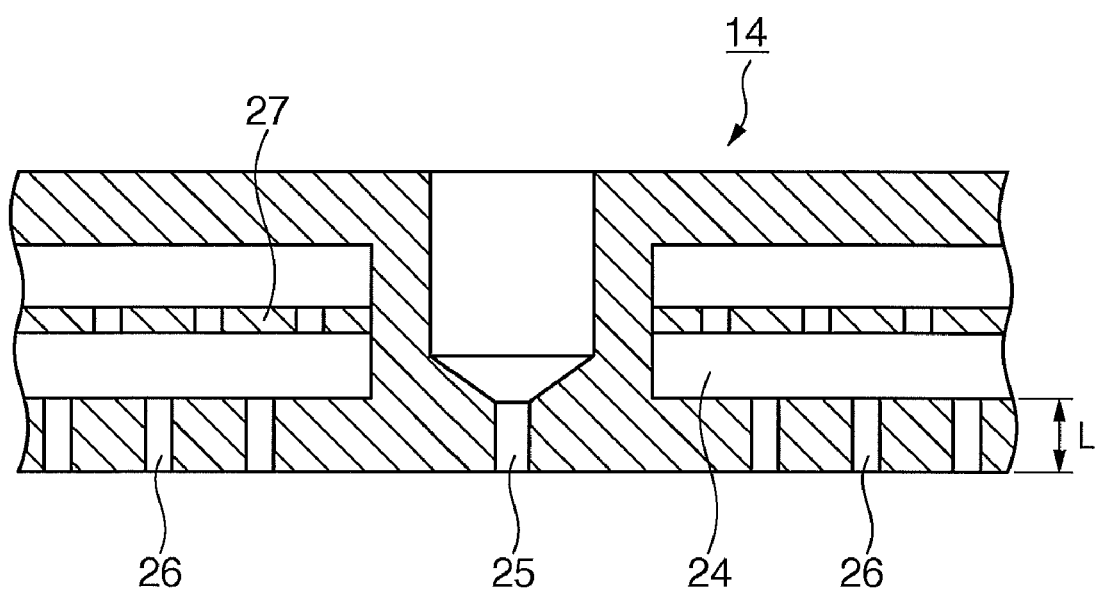
FIG. 2 is a partially enlarged sectional view showing the structure of a partition.
Figure 6:
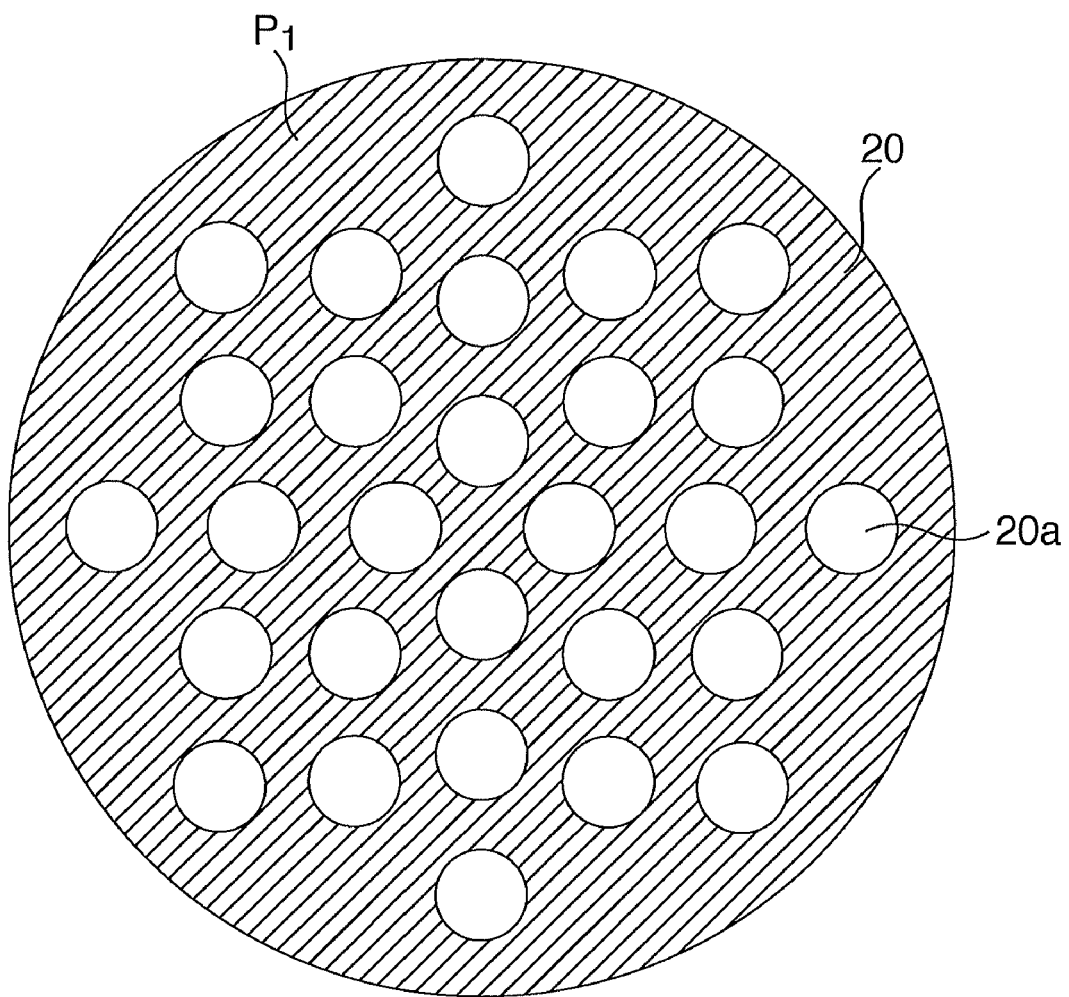
FIG. 6 is a plan view of an electrode 20 used in the apparatus shown in FIG. 1.

The first embodiment of a CVD apparatus will be explained below as an example of a vacuum processing apparatus according to the present invention with reference to FIGS. 1, 2, and 6. FIG. 1 is a longitudinal sectional view showing the first embodiment of the CVD apparatus according to the present invention. FIG. 2 is a partially enlarged sectional view showing the structure of a partition. FIG. 6 is a plan view of an electrode 20 used in the apparatus shown in FIG. 1.

This embodiment uses, for example, silane as a source gas, and deposits a silicon oxide film as a gate insulating film on the upper surface of a normal TFT glass substrate 11 (to be simply referred to as a "glass substrate 11" hereinafter). A vacuum vessel 12 of the CVD apparatus is a vacuum vessel (vacuum processing vessel) whose interior is held in a desired vacuum state by an evacuating mechanism (not shown) when performing deposition. The evacuating mechanism is connected to an exhaust port (not shown) formed in the vacuum vessel 12. In the present invention, it is also possible to use a silicon wafer substrate for a semiconductor device such as an MRAM or highly integrated circuit, instead of the glass substrate 11 described above.

A partition 14 made of a conductive member is horizontally installed inside the vacuum vessel 12. The partition 14 having, for example, a rectangular planar shape is installed such that its periphery is attached to an insulating member 21c.

The partition 14 partitions the interior of the vacuum vessel 12 into upper and lower chambers. The upper chamber forms a plasma generating space 15, and the lower chamber forms a substrate processing space 16. The partition 14 has a specific desired thickness, has a plate-like form as a whole, and also has a planar shape similar to the horizontal sectional shape of the vacuum vessel 12. Internal spaces 24 are formed in the partition 14.

The glass substrate 11 described above is placed on a substrate holding mechanism 17 installed in the substrate processing space 16. The glass substrate 11 is practically parallel to the partition 14, and set such that its deposition surface (upper surface) faces the lower surface of the partition 14.

The potential of the substrate holding mechanism 17 is held at the ground potential that is the same as the potential of the vacuum vessel 12. In addition, a heater (not shown) is formed inside the substrate holding mechanism 17. This heater holds the temperature of the glass substrate 11 at a predetermined temperature.

The structure of the vacuum vessel 12 will be further explained below. To improve the ease of assembly, the vacuum vessel 12 includes an upper vessel 12a forming the plasma generating space 15, and a lower vessel 12b forming the substrate processing space 16. When forming the vacuum vessel 12 by combining the upper vessel 12a and lower vessel 12b, the partition 14 is formed between them. The electrode 20 is attached such that the side surfaces of its periphery come in contact with an upper insulating member 21a of the insulating member 21a and an insulating member 21b interposed between the electrode 20 and upper vessel 12a, and the lower end face of the periphery comes in contact with the lower insulating member 21b. This forms the partitioned plasma generating space 15 and substrate processing space 16 above and below the partition 14.

In the CVD apparatus of this embodiment, a region where a plasma is generated in the plasma generating space 15 is formed by the partition 14, the upper vessel 12a, and the plate-like electrode (high-frequency electrode) 20 installed in an almost middle position between them. A plurality of holes 20a are formed in the electrode 20.

A power supply rod 29 connected to the electrode 20 is formed in the ceiling of the upper vessel 12a. The power supply rod 29 supplies high-frequency power P1 for discharge to the electrode 20. The electrode 20 functions as a high-frequency electrode. The power supply rod 29 is covered with an insulator (not shown), and insulated from other metal portions.

A gas reservoir 41 communicating with the plasma generating space 15 is formed throughout the entire periphery, or in at least two portions, of the inner sidewalls of the vacuum vessel 12. In this embodiment, in the upper portion of the base of the insulating member 21c on which the partition 14 is mounted, the groove-like (recessed) gas reservoir 41 is formed to surround the periphery of the partition 14. A gap 42 is formed between the lower surface of the insulating member 21b in contact with the lower end face of the periphery of the above-mentioned electrode 20, and the upper surface of the periphery of the partition 14. The gas reservoir 41 and plasma generating space 15 communicate with the sidewalls of the vacuum vessel 12 through the gap 42. Accordingly, no structure that readily causes abnormal discharge in the plasma generating space 15 occupies any part of the space.

An oxygen gas supply pipe 23 as a discharge gas supply system is connected to the gas reservoir 41 so as to extend through the lower vessel 12b. Oxygen gas for generating excited active species is supplied as a discharge gas from the oxygen gas supply pipe 23 to the gas reservoir 41, and sprayed from the above-mentioned gap 42 to the plasma generating space 15. Since the conductance of the gap 42 is smaller than that of the gas reservoir 41 in the circumferential direction, the oxygen gas supplied from the oxygen gas supply pipe 23 is sprayed to the plasma generating space 15 after being reserved in the gas reservoir 41 once. Accordingly, the oxygen gas is uniformly sprayed from the perimeter of the substrate. In this embodiment, the gas reservoir 41 is formed in the upper portion of the base of the insulating member 21c. However, the present invention is not limited to this, and the gas reservoir 41 need only be formed on the sidewalls of the vacuum vessel 12. For example, the gas reservoir 41 can also be formed around the partition 14, in the sidewalls of the vacuum vessel 12, or between the sidewalls of the upper vessel 12a and a top plate 13. In any of these arrangements, the gas reservoir 41 must be formed to be symmetrical with respect to the center of the substrate, and the oxygen gas supply pipe 23 as a discharge gas supply system must be connected to the gas reservoir 41.

In the present invention, it is also possible to use, instead of the above-mentioned oxygen gas, an inert gas such as helium (He) gas, argon (Ar) gas, xenon (Xe) gas, or krypton (Kr) gas as a carrier gas, and hydrogen gas or nitrogen gas as a reactive gas.

The partition 14 partitions the interior of the vacuum vessel 12 into the plasma generating space 15 and substrate processing space 16. In the partition 14, a plurality of through holes 25 having dimensions (e.g., a length and diameter) and a structure that prevent the source gas supplied to the substrate processing space 16 from reversely diffusing toward the plasma generating space 15 are dispersedly formed to extend through the internal spaces 24. For example, the plasma generating space 15 and substrate processing space 16 communicate with each other through only the through holes 25. For example, those dimensions (e.g., the length and diameter) and structure of the through hole 25, which prevent the source gas supplied to the substrate processing space 16 from reversely diffusing toward the plasma generating space 15, satisfy the following condition.

$$uL/D > 1$$

u: the gas flow velocity in the through hole 25

L: the substantial length of the through hole 25 (see FIG. 2)

D: the mutual gas diffusion coefficient (the mutual gas diffusion coefficient between gases on the two sides of the through hole 25, that is, in the plasma generating space 15 and substrate processing space 16)

Referring to FIG. 2, the portion above the partition 14 corresponds to the plasma generating space 15 (FIG. 1), and the portion below the partition 14 corresponds to the substrate processing space 16 (FIG. 1). The internal space 24 formed in the partition 14 is a space for dispersing the source gas external supplied to the partition 14, and uniformly supplying the dispersed gas to the substrate processing space 16. In addition, a plurality of diffusing holes 26 for supplying the source gas to the substrate processing space 16 are formed in the lower plate of the partition 14.

A source gas supply pipe (not shown) for externally supplying the source gas is connected to the internal spaces 24. The source gas supply pipe is also connected to a pipe for supplying a carrier gas such as He (helium) gas. Accordingly, the source gas is supplied in a state in which the carrier gas is added to the source gas. In the internal space 24, a uniformizing plate 27 perforated to have a plurality of holes is almost horizontally formed so as to uniformly supply the source gas from the diffusing holes 26 to the substrate processing space 16. The uniformizing plate 27 divides the internal space 24 of the partition 14 into upper and lower spaces. The source gas supplied from the source gas supply pipe to the internal space 24 of the partition 14 is supplied to the upper space, moved to the lower space through the holes in the uniformizing plate 27, and diffused in the substrate processing space 16 through the diffusing holes 26. The source gas can uniformly be supplied throughout the whole substrate processing space 16 based on the above structure.

A deposition method performed by the CVD apparatus constructed as above will be explained below. A transfer robot (not shown) carries the glass substrate 11 inside the vacuum vessel 12, and loads the glass substrate 11 on the substrate holding mechanism 17. The interior of the vacuum vessel 12 is evacuated and held in a predetermined vacuum state by the evacuating mechanism. Then, oxygen gas for generating excited active species is supplied from the oxygen gas supply pipe 23 into the gas reservoir 41, and sprayed to the plasma generating space 15 through the gap 42 described above. An external mass flow controller (not shown) controls the flow rate of the oxygen gas.

On the other hand, silane as an example of the source gas is supplied to the internal spaces 24 of the partition 14 through the supply pipe (not shown). Silane is diffused in the internal spaces 24, and supplied to the substrate processing space 16 through the diffusing holes 26 directly, that is, without contacting a plasma. Since an electric current is supplied to the heater, the substrate holding mechanism 17 installed in the substrate processing space 16 is held at a predetermined temperature in advance.

In the above state, high-frequency power is supplied to the electrode 20 via the power supply rod 29. This high-frequency power causes discharge, and generates an oxygen plasma around the electrode 20 in the plasma generating space 15. By thus generating the oxygen plasma, radicals (excited active species) as neutral excited species are generated.

The partition 14 partitions the internal space of the vacuum vessel 12 into the plasma generating space 15 and substrate processing space 16. When performing deposition on the glass substrate 11, an oxygen plasma is uniformly generated in the plasma generating space 15 by uniformly supplying oxygen gas from the perimeter via the oxygen gas supply pipe 23, gas reservoir 41, and air space 42, and supplying high-frequency power to the electrode 20. On the other hand, in the substrate processing space 16, silane as the source gas is directly supplied through the internal spaces 24 and diffusing holes 26 in the partition 14. Of the oxygen plasma uniformly generated in the plasma generating space 15, neutral radicals having a long life are uniformly dispersed through the plurality of through holes 25 in the partition 14 and supplied to the substrate processing space 16, but many charged particles become extinct. Silane is directly supplied to the substrate processing space 16 through the internal spaces 24 and diffusing holes 26 in the partition 14. Also, silane directly supplied to the substrate processing space 16 is prevented from reversely diffusing toward the plasma generating space based on the hole diameter (opening area) of the through hole 25. As described above, silane as the source gas does not directly come in contact with the oxygen plasma when supplied to the substrate processing space 16. This prevents a vigorous reaction between silane and the oxygen plasma. In the substrate processing space 16, a silicon oxide film is thus deposited on the surface of the glass substrate 11 set opposite to the lower surface of the partition 14.

As described above, the plasma generating space 15 and substrate processing space 16 are partitioned and isolated as closed chambers by the partition 14 having large numbers of through holes 25 and diffusing holes 26 having the above characteristics. Therefore, silane directly supplied to the substrate processing space 16 hardly comes in contact with the oxygen plasma.

In the CVD apparatus of the first embodiment as explained above, the gas reservoir 41 is formed on the sidewalls of the vacuum vessel 12, and the oxygen gas supply pipe 23 for supplying oxygen gas for generating exited active species is connected to the gas reservoir 41. The gas reservoir 41 communicates with the plasma generating space 15 throughout the entire circumference of the sidewalls of the vacuum vessel 12. When oxygen gas is supplied from the oxygen gas supply pipe 23 into the gas reservoir 41, therefore, the oxygen gas is uniformly supplied from the perimeter of the plasma generating space 15, so it is possible to uniformly generate a plasma and dispersedly generate neutral active species. This makes it possible to prevent the nonuniformity of neutral active species passing through the plurality of through holes 25 in the partition 14, and achieve a uniform deposition distribution and film property distribution of a silicon oxide film deposited on the surface of the glass substrate 11 in, for example, a CVD apparatus.

In addition, the improvement can be made by only grooving the sidewalls of the vacuum vessel 12, and any measure to prevent abnormal discharge is also unnecessary.

Figure 3:
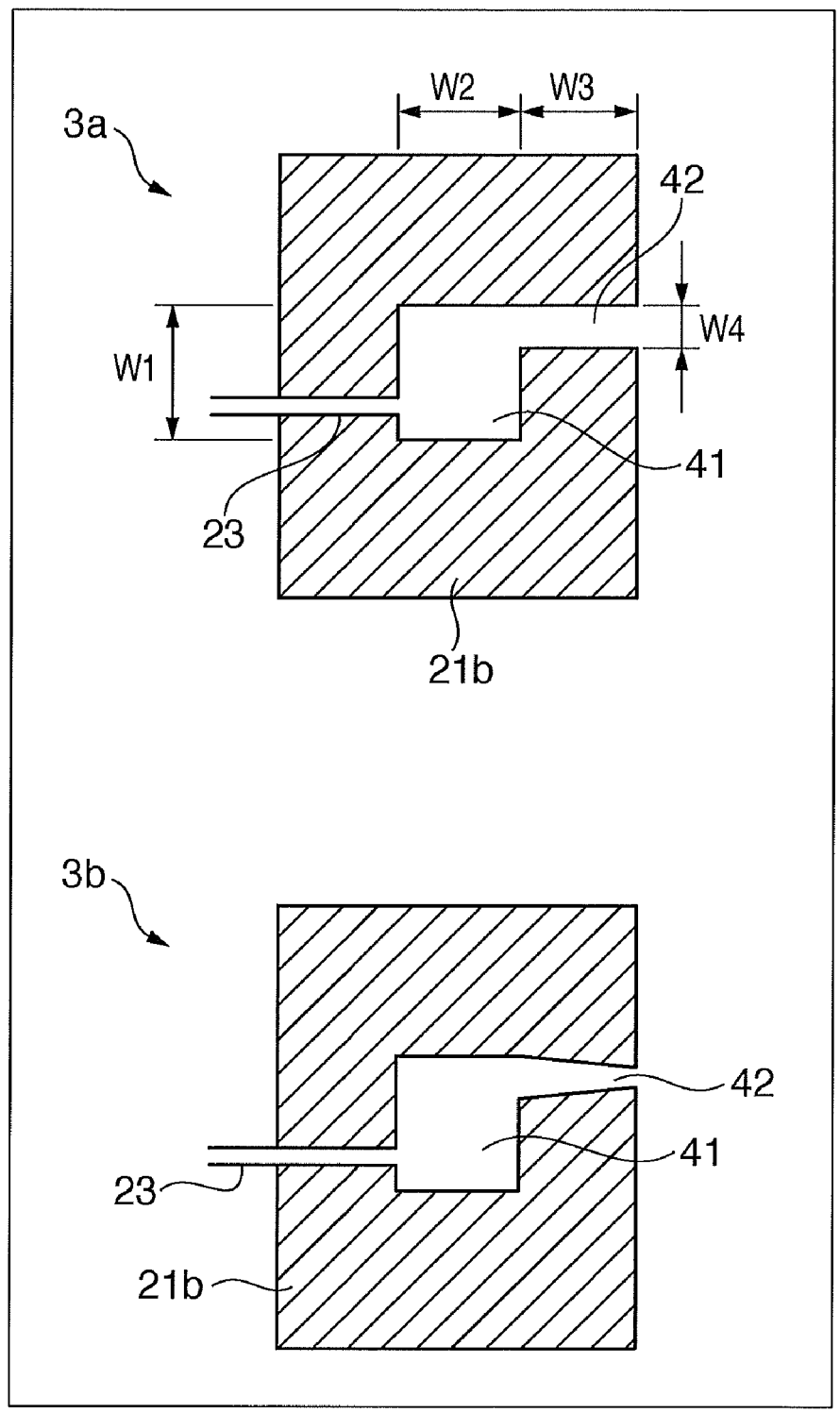
FIG. 3 is a longitudinal sectional view showing an embodiment of a gas reservoir according to the present invention.

In this embodiment, the gas reservoir 41 is formed in the upper portion of the base of the insulating member 21c. However, the present invention is not limited to this, and the gas reservoir 41 need only be formed on the sidewalls of the vacuum vessel 12. FIG. 3 is a sectional view of the gas reservoir 41 and gap 42 when they are directly opposed to the insulating member 21b. In FIG. 3, reference numeral 3a denotes a structure in which the sectional shape of the gap 42 is a rectangle; and 3b, a structure in which the gap 42 has a tapered section that narrows from the gas reservoir toward the vacuum processing vessel. In either structure, the conductance of the gap 42 is smaller than that of the gas reservoir 41 in the circumferential direction. Accordingly, oxygen gas supplied from the oxygen gas supply pipe 23 is reserved in the gas reservoir 41 once and then sprayed to the plasma generating space 15 via the gap 42. Since the oxygen gas is uniformly sprayed from the perimeter of the substrate, the gas flow on the substrate can be uniformized.

Figure 4:
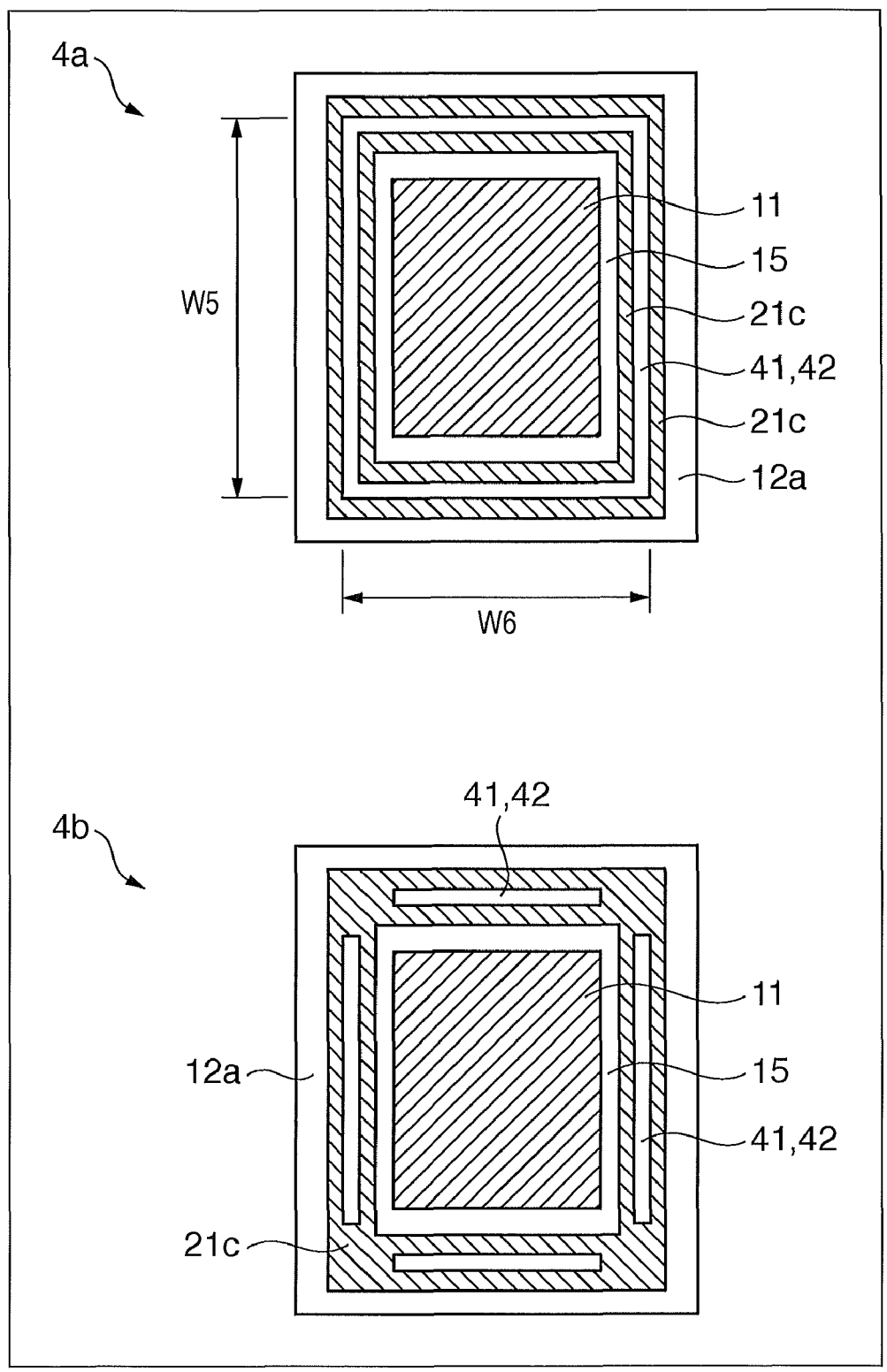
FIG. 4 is an A-A' sectional view of the first embodiment of the CVD apparatus according to the present invention.

FIG. 4 is a view showing structures in which the gas reservoir 41 and gap 42 are formed on the sidewalls of the vacuum vessel 12. That is, FIG. 4 is an A-A' sectional view of the CVD apparatus of the first embodiment shown in FIG. 1. Note that in FIG. 4, the partition 14 is omitted in order to clarify the positional relationship with the substrate. In FIG. 4, reference numeral 4a denotes the structure of the first embodiment in which the gas reservoir is formed throughout the whole circumference along the sidewalls of the vacuum vessel; and 4b, the structure of another embodiment in which the gas reservoir is formed in four portions along the sidewalls of the vacuum vessel. In either structure, the gas reservoir must be formed in positions symmetrical with respect to the center of the substrate in order to uniformly spray oxygen gas from the perimeter of the substrate.

The prevent inventor made extensive studies on the dimensions of the individual portions of the gas reservoir 41, and has found that when the total length ($2 \times W5 + 2 \times W6$) of the gas reservoir 41 in the circumferential direction shown in FIG. 4 is 2 m, a uniform deposition distribution and film property distribution can be achieved if W1=W2=W3=10 mm, W4=0.05 mm, and W4 is 0.05 mm or less.

Figure 5:
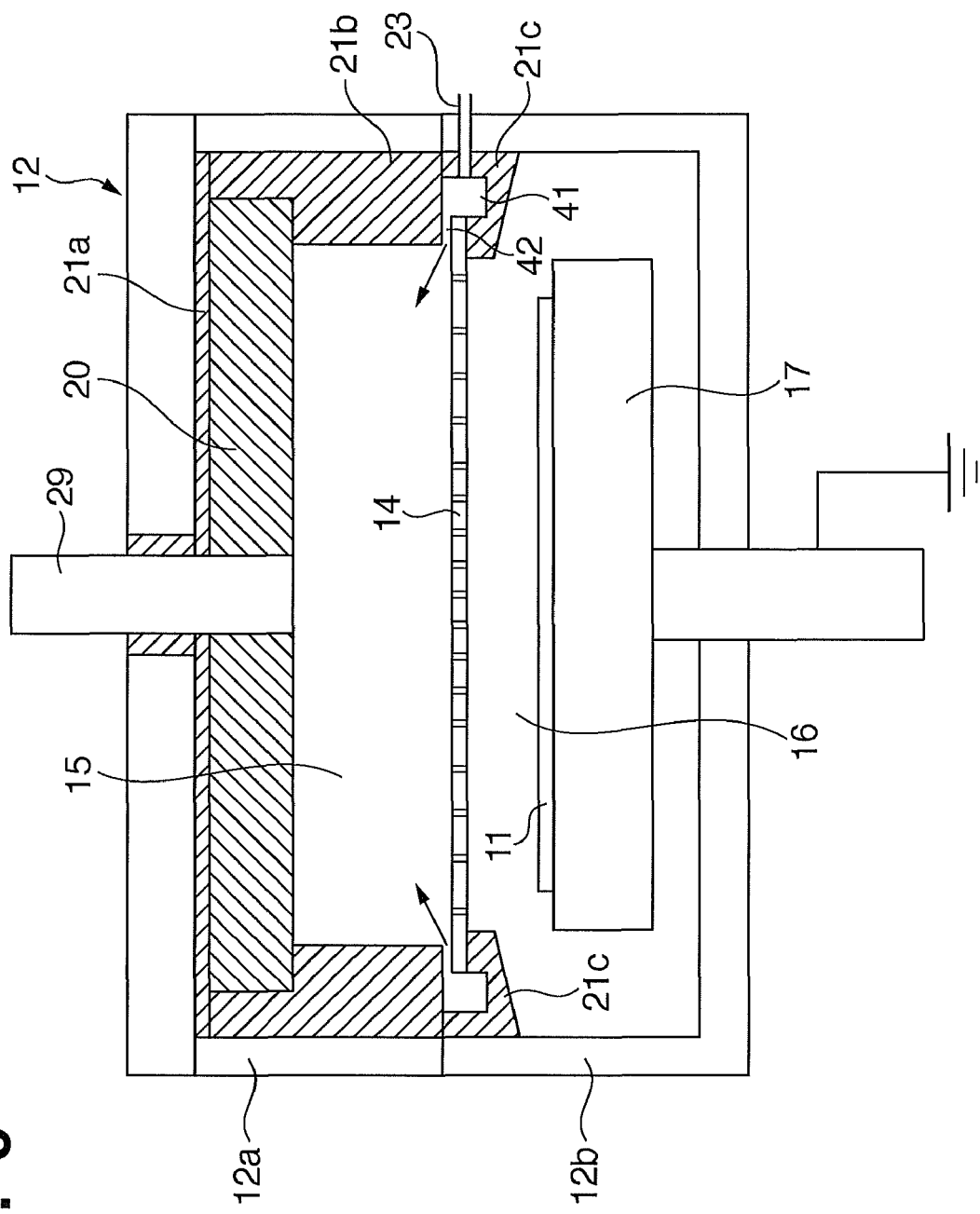
FIG. 5 is a longitudinal sectional view showing the second embodiment of the CVD apparatus according to the present invention.

FIG. 5 is a longitudinal sectional view showing the second embodiment of the CVD apparatus as the vacuum processing apparatus according to the present invention. In the CVD apparatus of the second embodiment, an insulating member 21a is formed inside the ceiling of an upper vessel 12a, and an electrode 20 is installed below the insulating member 21a. The electrode 20 has no such holes 20a as used in the first embodiment, and has the form of a single plate. The electrode 20 and a partition 14 form a plasma generating space 15 having a parallel plate electrode structure. The rest of the arrangement is practically the same as that of the first embodiment. In FIG. 4, therefore, the same reference numerals as in the first embodiment denote practically the same elements as those explained in the first embodiment, and a detailed explanation will not be repeated. Also, the functions and effects of the CVD apparatus of the second embodiment are the same as those of the first embodiment described previously.

The above-mentioned embodiments have been explained by taking silane as an example of the source gas in, for example, a CVD apparatus for depositing a silicon oxide film. However, the present invention is not limited to this, and it is of course also possible to use another source gas such as TEOS (tetraethoxy silane). It is further possible to use a cleaning gas such as $CF_4$ gas or an etching gas such as methanol gas, methane gas, or CO gas to be used when forming an MRAM.

In addition, the present invention is applicable not only to a silicon oxide film but also to deposition of, for example, a silicon nitride film. The concept of the principle of the present invention is applicable to every processing having the problems that particles are generated because a source gas comes in contact with a plasma, and that ions strike a substrate, and applicable to, for example, deposition, surface processing, or isotropic etching.

Although the internal space 24 of the partition 14 has a double structure, it is of course also possible to use a multi-layered structure such as a triple structure or higher-order structure as needed.

In this embodiment, a method of depositing a silicon oxide film as a gate insulating film on the upper surface of a rectangular TFT glass substrate has been explained. However, the present invention is not limited to this, and a disk-like semiconductor substrate or the like may also be used as a substrate to be processed. In this case, it is naturally possible to deposit, on the upper surface of the semiconductor substrate, a high-k film such as High-k or the like, in addition to a thermal oxide film as a gate insulating film necessary for a magnetic disk head or a memory element such as an MRAM.

Although the preferred embodiments of the present invention have been explained above with reference to the accompanying drawings, the present invention is not limited to these embodiments and can be changed into various forms within the technical scope grasped from the description of the scope of the appended claims.

The present invention is not limited to the above embodiments and various changes and modifications can be made without departing from the spirit and scope of the invention. Therefore, to apprise the public of the scope of the present invention, the following claims are appended.

The invention claimed is:

1. A vacuum processing apparatus comprising:
    a conductive partition which is positioned inside a vacuum processing vessel, partitions an internal space of the vacuum processing vessel into a plasma generating space and a substrate processing space, and has a plurality of through holes for communicating with the plasma generating space and the substrate processing space;

a high-frequency electrode which is positioned in the plasma generating space, and is positioned so as to be opposite to said conductive partition;

a gas reservoir is configured by a first insulating member which is positioned in a side of the substrate processing space and has a recessed sectional shape formed along a circumference portion of said conductive partition, and a second insulating member which is positioned along a circumference portion of said high-frequency electrode in a side of the plasma generating space and is arranged so as to be opposite to the first insulating member; and a gas supply system is connected to said gas reservoir in order to supply a gas to said gas reservoir, wherein said gas reservoir has a gap for spraying the gas supplied from said gas supply system to said gas reservoir to the plasma generating space between the second insulating member and an upper surface of the circumference portion of said conductive partition.

2. The vacuum processing apparatus according to claim 1, wherein the gap has a tapered sectional shape in which a size of an opening on a side of the plasma generating space is smaller than a size of an opening on a side of said gas reservoir.

3. The vacuum processing apparatus according to claim 2, the size of the opening on the side of the plasma generating space is 0.05 mm or less.

* * * * *